United States Patent
Maya et al.

(10) Patent No.: US 10,282,176 B2
(45) Date of Patent: May 7, 2019

(54) MANAGEMENT APPARATUS AND MANAGEMENT METHOD

(71) Applicant: Hitachi, Ltd., Tokyo (JP)

(72) Inventors: Yuzuru Maya, Tokyo (JP); Kouji Amano, Tokyo (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 15/500,565

(22) PCT Filed: Jan. 30, 2015

(86) PCT No.: PCT/JP2015/052685
§ 371 (c)(1),
(2) Date: Jan. 31, 2017

(87) PCT Pub. No.: WO2016/121101
PCT Pub. Date: Aug. 4, 2016

(65) Prior Publication Data
US 2017/0212736 A1    Jul. 27, 2017

(51) Int. Cl.
*G06F 8/36* (2018.01)
*G06F 3/0482* (2013.01)
(Continued)

(52) U.S. Cl.
CPC .............. *G06F 8/36* (2013.01); *G06F 3/0482* (2013.01); *G06F 8/10* (2013.01); *G06F 8/24* (2013.01);
(Continued)

(58) Field of Classification Search
CPC ....................................................... G06F 8/36
(Continued)

(56) References Cited

U.S. PATENT DOCUMENTS

| | | | |
|---|---|---|---|
| 7,080,350 B2 * | 7/2006 | Saimi .................... | G06F 8/20 715/234 |
| 2012/0124211 A1 * | 5/2012 | Kampas ................. | G06F 9/50 709/226 |

(Continued)

FOREIGN PATENT DOCUMENTS

JP    2014-109900 A    6/2014

OTHER PUBLICATIONS

International Search Report of PCT/JP2015/052685 dated Mar. 24, 2015.

*Primary Examiner* — Duy Khuong T Nguyen
*Assistant Examiner* — Theodore E Hebert
(74) *Attorney, Agent, or Firm* — Mattingly & Malur, PC

(57) ABSTRACT

A management apparatus and method capable of enhancing reliability of a computer system built by setting parameters are proposed. A management apparatus for managing a construction target system capable of constructing a computer system with desired system specifications by setting respective values of specified parameters: creates a logical model that is a logical model of the computer system with the required system specifications; classifies each of parameters for each of templates, to which respective values are set to construct the computer system with the required system specifications, with respect to each item of the system specifications; compares the values of the parameters for the required system specifications with values of corresponding parameters which are set to the templates; verifies whether or not the computer system to be built according to each parameter whose value is set to each template satisfies the required system specifications; and displays the verification result.

12 Claims, 14 Drawing Sheets

(51) Int. Cl.
*G06F 9/448* (2018.01)
*G06F 8/20* (2018.01)
*G06F 8/60* (2018.01)
*G06F 8/71* (2018.01)
*G06F 9/445* (2018.01)
*G06F 9/48* (2006.01)
*G06F 15/16* (2006.01)
*G06F 17/50* (2006.01)
*G06F 8/10* (2018.01)
*G06F 11/07* (2006.01)
*G06F 11/30* (2006.01)
*G06F 11/34* (2006.01)

(52) U.S. Cl.
CPC ............... *G06F 8/60* (2013.01); *G06F 8/71* (2013.01); *G06F 9/4451* (2013.01); *G06F 9/4488* (2018.02); *G06F 9/4843* (2013.01); *G06F 11/0709* (2013.01); *G06F 11/3051* (2013.01); *G06F 11/3409* (2013.01); *G06F 15/16* (2013.01); *G06F 17/50* (2013.01)

(58) Field of Classification Search
USPC .......................................................... 717/107
See application file for complete search history.

(56) References Cited

U.S. PATENT DOCUMENTS

| | | | |
|---|---|---|---|
| 2013/0232463 A1* | 9/2013 | Nagaraja | G06F 8/61 717/101 |
| 2014/0075032 A1* | 3/2014 | Vasudevan | H04L 41/50 709/226 |
| 2014/0156851 A1* | 6/2014 | Suami | G06F 9/45558 709/226 |
| 2014/0278808 A1* | 9/2014 | Iyoob | G06Q 30/0206 705/7.35 |
| 2015/0222723 A1* | 8/2015 | Adapalli | H04L 67/2809 705/26.41 |
| 2016/0337356 A1* | 11/2016 | Simon | H04L 63/10 |
| 2017/0180487 A1* | 6/2017 | Frank | H04L 67/16 |
| 2017/0212736 A1* | 7/2017 | Maya | G06F 9/4488 |

* cited by examiner

FIG.5

System Specifications Regarding System Configuration (A)

| Element | Content |
|---|---|
| Number of Servers | 2 |
| Backup Method | Hot Standby |
| CPU | 2GHz Number of Cores:4 |
| Memory | 4GB |
| Disk | 1TB |
| NIC | 1Gbit/s Quantity:2 |
| Server Name | BS-1 |
| OS | OS-1 |
| HA Software | HA-1 |
| DB | DB-1 |

System Specifications Regarding Availability (B)

| Failed Part | Detected Position | Detection Time |
|---|---|---|
| Server Fault | HA Software | 10 Seconds |
| Process Fault | HA Software | 20 Seconds |
| Storage Fault | OS | 10 Seconds |
| Network Fault | OS | 20 Seconds |

System Specifications Regarding Performance (C)

| Position | Performance Item | Value |
|---|---|---|
| Server | Throughput | 100 TPS |
| Server | Response Time | 5 Seconds |

FIG.6

(A) Hardware Template — 20A

| Parameter | Value |
|---|---|
| Server Name | BS-1 |
| Number of Servers | 2 |
| Backup Method | Hot Standby |
| CPU | 2GHz Number of Cores:4 |
| Memory | 4GB |
| Storage | 1TB |
| NIC | 1Gbit/s Quantity:2 |
| System Availability | 99.99(%) |

(B) OS Template — 20B

| Parameter | Value |
|---|---|
| OS Name | OS-1 |
| Server Monitoring Interval | 30 Seconds |
| Process Monitoring Interval | 30 Seconds |
| Storage Monitoring Interval | 10 Seconds |
| Network Monitoring Interval | 20 Seconds |
| Number of Processes | 10 |
| Number of Terminal Connections | 100 |

(C) HA Software Template — 20C

| Parameter | Value |
|---|---|
| HA Software Name | HA-1 |
| Number of Servers | 2 |
| Backup Method | Hot Standby |
| Heartbeat Interval | 3 Seconds |
| Number of Heartbeats | 3 |
| Process Monitoring Interval | 20 Seconds |

(D) DB Template — 20D

| Parameter | Value |
|---|---|
| DB Name | DB-1 |
| Number of Servers | 2 |
| Process Monitoring Interval | 30 Seconds |
| Buffer Size | 500MB |

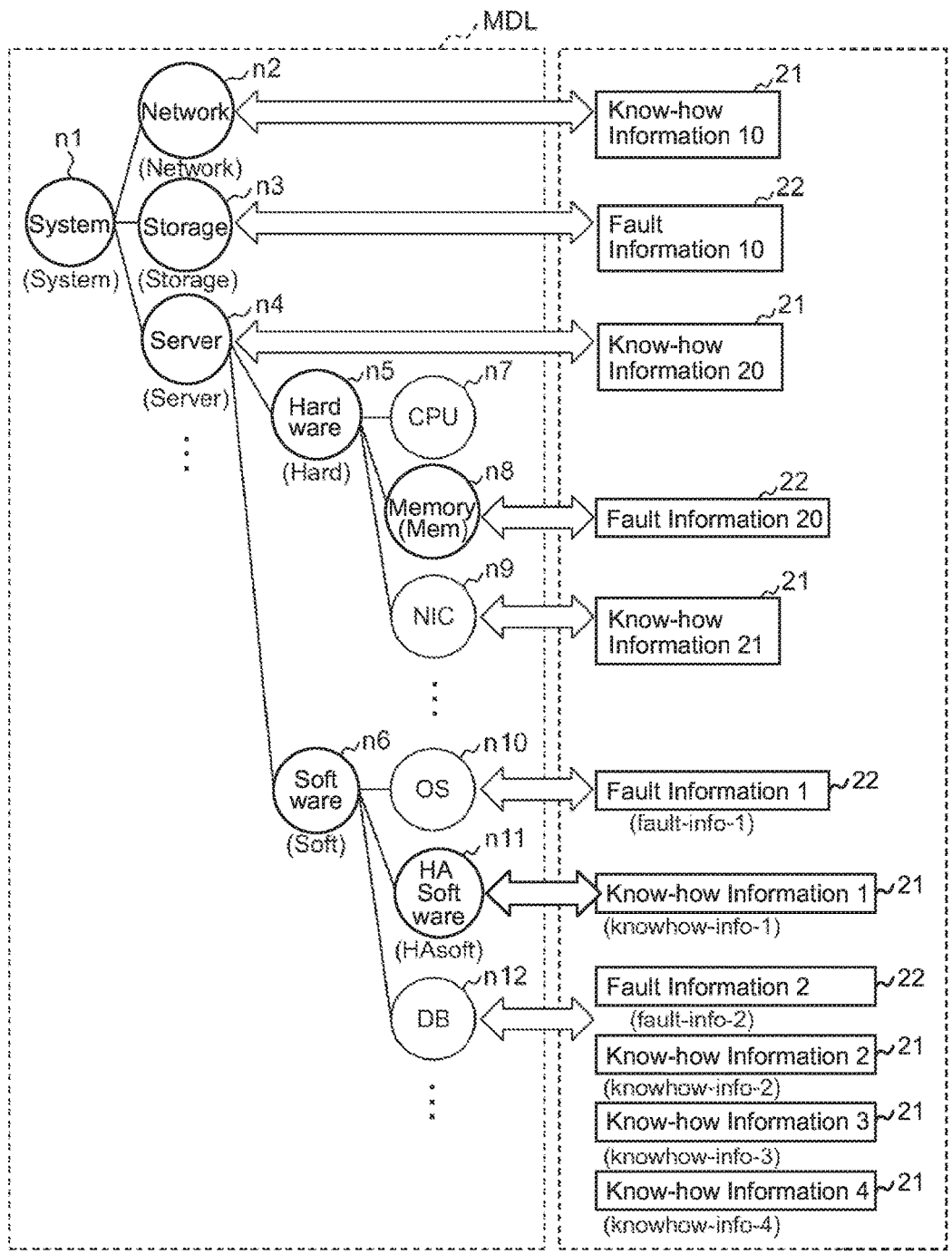

FIG.8

First Know-how Information 21A (A)

| Main | Related Target | Content |
|---|---|---|
| HA-1 | Process Monitoring (mon_process) | Equal to or Less Than Heartbeat Interval (LT(heratbeat)) |
| DB-1 | Memory (mem) | 8 GB |

Second Know-how Information 21B (B)

| Buffer Size | 100MB | 500MB | 1GB |
|---|---|---|---|
| Throughput | 50TPS | 100 TPS | 100 TPS |
| Response Time | 10 Seconds | 5 Seconds | 2 Seconds |

FIG.9

Fault Information 22

| Failed Part | Fault Recovery Processing |
|---|---|
| OS | System Switching |
| DB | System Switching |

FIG.10

(A) Only System Configuration
「System. Server. Hard. CPU」

(B) System Configuration and Know-how Information
「System.Server.Soft.HAsoft;knowhow-info-1」

(C) System Construction and Fault Information
「System. Server. Soft. OS : fault-info-1」

(D) System Construction, Know-how Information, and Fault Information
「System.Server.Soft.DB:fault-info-2;knowhow-info-2」

(E-1) Know-how Information
knowhow-info-1
「HA-1. mon_process. LT(heartbeat)」

(E-2) Know-how Information
knowhow-info-2
「DB-1. mem. 8GB.2」

(F-1) Fault Information
fault-info-1
「Fault_recovery. failover」

(F-2) Fault Information
fault-info-2
「Fault_recovery. failover」

FIG.11

(A) System Configuration — 60A

| System Configuration | Hardware | OS | HA Software | DB |
|---|---|---|---|---|
| Applied Product | BS-1 | OS-1 | HA-1 | DB-1 |
| Backup Method | Hot Standby | — | Hot Standby | — |
| Number of Servers | 2 | — | 2 | 2 |
| CPU | 2GHz Number of Cores:4 | — | — | — |
| Memory | 4GB | — | — | — |
| Disk | 1TB | — | — | — |
| NIC | 1Gbit/s Quantity:2 | — | — | — |
| System Availability | 99.99 | — | — | — |

(B) Availability — 60B

| Failed Part | Hardware | OS | HA Software | DB |
|---|---|---|---|---|
| Server Fault | — | 30 Seconds | 10 Seconds | — |
| Process Fault | — | 30 Seconds | 20 Seconds | — |
| Storage Fault | — | 10 Seconds | — | — |
| Network Fault | — | 20 Seconds | — | 30 Seconds |

(C) Performance — 60C

| Performance | Hardware | OS | HA Software | DB |
|---|---|---|---|---|
| Throughput | — | Number of Processes:10 | — | Buffer Size :500MB |
| Response Time | — | Number of Terminals:100 | — | |

FIG.12

Parameter Table (System Configuration) 60A

| System Configuration | Hardware | OS | HA Software | DB |
|---|---|---|---|---|
| Applied Product | BS-1 | OS-1 | HA-1 | DB-1 |
| Backup Method | Hot Standby | — | Hot Standby | — |
| Number of Servers | 2 | — | 2 | 2 |
| CPU | 2GHz Number of Cores:4 | — | — | — |
| Memory | 4GB | — | — | — |
| Disk | 1TB | — | — | — |
| NIC | 1Gbit/s Quantity:2 | — | — | — |
| System Availability | 99.99 | — | — | — |

| Element | Content |
|---|---|
| Number of Servers | 2 |
| Backup Method | Hot Standby |
| CPU | 2GHz Number of Cores:4 |
| Memory | 4GB |
| Disk | 1TB |
| NIC | 1Gbit/s Quantity:2 |
| OS | OS-1 |
| HA Software | HA-1 |
| DB | DB-1 |

System Specifications (System Configuration)

FIG.13

Parameter Table (Availability) 60B

| Failed Part | Hardware | OS | HA Software | DB |
|---|---|---|---|---|
| Server Fault | — | 30 Seconds | 10 Seconds | — |
| Process Fault | — | 30 Seconds | 20 Seconds | — |
| Storage Fault | — | 10 Seconds | — | — |
| Network Fault | — | 20 Seconds | — | 20 Seconds |

| Failed Part | Detected Position | Detection Time |
|---|---|---|
| Server Fault | HA Software | 10 Seconds |
| Process Fault | HA Software | 20 Seconds |
| Storage Fault | OS | 10 Seconds |
| Network Fault | OS | 20 Seconds |

System Specifications (Availability)

FIG.14

Know-how Information 21

| Buffer Size | 100MB | 500MB | 1GB |
|---|---|---|---|
| Throughput | 50 TPS | 100 TPS | 100 TPS |
| Response Time | 10 Seconds | 5 Seconds | 2 Seconds |

| Position | Performance Item | Value |
|---|---|---|
| Server | Throughput | 100 TPS |
| Server | Response Time | 5 Seconds |

System Specifications (Performance)

MANAGEMENT APPARATUS AND MANAGEMENT METHOD

TECHNICAL FIELD

The present invention relates to a management apparatus and a management method, and is suited for use in, for example, a management apparatus configured by combining components of a plurality of vendors, and manages a configuration target system capable of constructing a computer system with desired system specifications by setting respective values of specified parameters.

BACKGROUND ART

In recent years, components such as hardware, OSs (Operating Systems), and application software are under being promoted to be provided by a plurality of vendors, in the computer system field. Each vendor prepares templates of a plurality of patterns regarding parameters with respect to their products and a system engineer constructs a computer system with required specifications by setting each of individual parameters by combining the templates of each vendor.

Note that PTL 1 discloses configuration of a virtual system which is the same as a source virtual system by reproducing a template of the virtual system in relation to a template of parameters, and allocating hardware resources to the reproduced template.

CITATION LIST

Patent Literature

PTL 1: Japanese Patent Application Laid-Open (Kokai) Publication No. 2014-109900

SUMMARY OF THE INVENTION

Problems to be Solved by the Invention

Meanwhile, when the system engineer configures the computer system, it is necessary to set values of the respective parameters listed on the template with respect to each component by referring to manuals prepared by each vendor. Therefore, there is a fear that the number of parameters to be set by the system engineer may become enormous and a human error may cause a serious fault which might result in a system halt.

The present invention was devised in consideration of the above-described circumstances, and aims at proposing a management apparatus and management method capable of enhancing reliability of a computer system which is built by setting parameters.

Means to Solve the Problems

In order to solve the above-described problems, provided according to the present invention is a management apparatus for managing a construction target system configured by combining components provided by a plurality of vendors, and capable of constructing a computer system with desired system specifications by setting respective values of specified parameters, wherein the management apparatus includes: a storage unit that stores a plurality of templates prepared in advance and designed to set each of parameters regarding the corresponding components; a structuring ID processing unit that creates a logical model which is a logical model of the computer system with the required system specifications; and a template processing unit that classifies each of the parameters for each of the templates, to which respective values are set to construct the computer system with the required system specifications, with respect to each item of the system specifications, compares the values of the parameters for the required system specifications with values of corresponding parameters, which are set to the templates, with respect to each item, thereby verifies whether or not the computer system to be built according to each of the parameters whose value is set to each of the templates satisfies the required system specifications, and displays a result of the verification.

Furthermore, provided according to the present invention is a management method executed by a management apparatus for managing a construction target system configured by combining components of a plurality of vendors, and capable of constructing a computer system with desired system specifications by setting respective values of specified parameters, wherein the management apparatus includes a storage unit that stores a plurality of templates prepared in advance, and designed to set each of parameters regarding the corresponding components; and wherein the management method includes: a first step executed by the management apparatus creating a logical model which is a logical model of the computer system with the required system specifications; and a second step executed by the management apparatus classifying each of the parameters for each of the templates, to which respective values are set to construct the computer system with the required system specifications, with respect to each item of the system specifications, comparing the values of the parameters for the required system specifications with values of corresponding parameters, which are set to the templates, with respect to each item, verifying whether or not the computer system to be built according to each of the parameters whose value is set to each of the templates satisfies the required system specifications, and displaying a result of the verification.

When the management apparatus and method according to the present invention are used, a user can recognize, on the basis of the displayed verification result, whether or not the computer system built according to each parameter whose value is set to each template satisfies the required system specifications. So, for example, it is possible to effectively prevent the occurrence of a serious fault which might result in a system halt due to a human error.

Advantageous Effects of the Invention

According to the present invention, reliability of the computer system built by setting the parameters can be enhanced.

BRIEF DESCRIPTION OF DRAWINGS

FIG. 5A is a chart illustrating an example of system specifications regarding a system configuration, FIG. 5B is a chart illustrating an example of system specifications regarding availability, and FIG. 5C is a chart illustrating an example of system specifications regarding performance;

FIG. 6A is a chart illustrating an example of a hardware template, FIG. 6B is a chart illustrating an example of an OS template, FIG. 6C is a chart illustrating an example of an HA software template, and FIG. 6D is a chart illustrating an example of a DB template;

FIG. 7 is a conceptual diagram for explaining a logical model;

FIGS. 8A and 8B are charts illustrating an example of first and second know-how information;

FIG. 9 is a chart illustrating an example of fault information;

FIG. 10A to FIG. 10E-2 are diagrams for explaining logical model display forms;

FIG. 11A to FIG. 11C are charts illustrating an example of parameter tables regarding the system configuration, availability, and performance, respectively;

FIG. 12 is charts for explaining parameter value verification processing regarding the system configuration;

FIG. 13 is charts for explaining parameter value verification processing regarding the availability;

FIG. 14 is charts for explaining parameter value verification processing regarding the performance;

BRIEF DESCRIPTION OF DRAWINGS

An embodiment of the present invention will be explained in detail below with reference to drawings.

Figure 1:
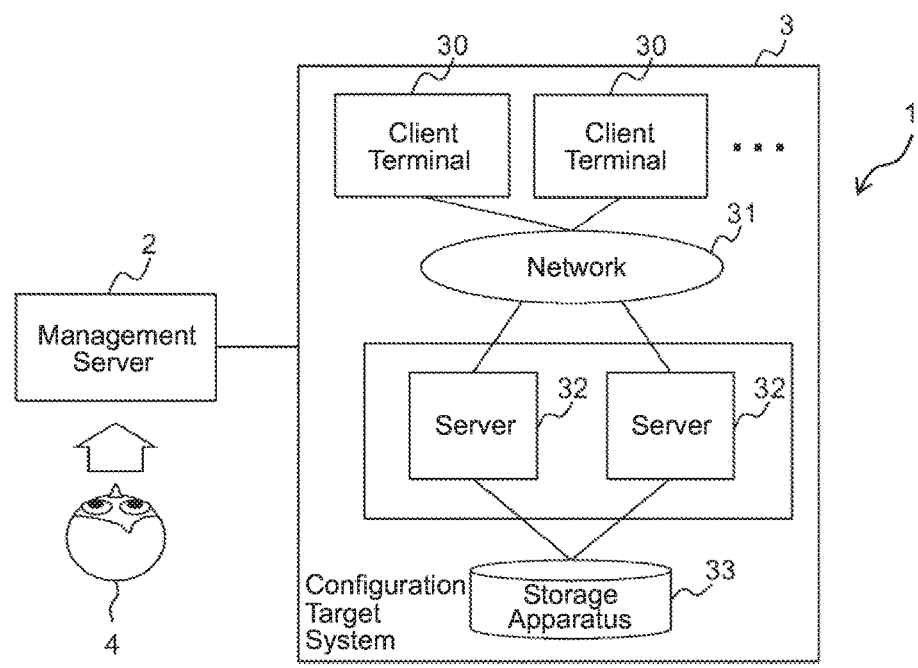
FIG. 1 is a block diagram illustrating a schematic configuration of an information processing system according to this embodiment.

(1) Configuration of Information Processing System According to this Embodiment Referring to FIG. 1, reference numeral 1 represents an information processing system according to this embodiment as a whole. This information processing system 1 is composed of a management server 2 and a construction target system 3.

The management server 2 is configured of, for example, a general-purpose server system, and is used when a system engineer 4 constructs a computer system with system specifications according to a user request. Specifically speaking, the system engineer 4 constructs the computer system with such system specifications by setting parameters, whose values are according to the system specifications requested by the user, to server systems 32 for the construction target system 3.

Figure 2:
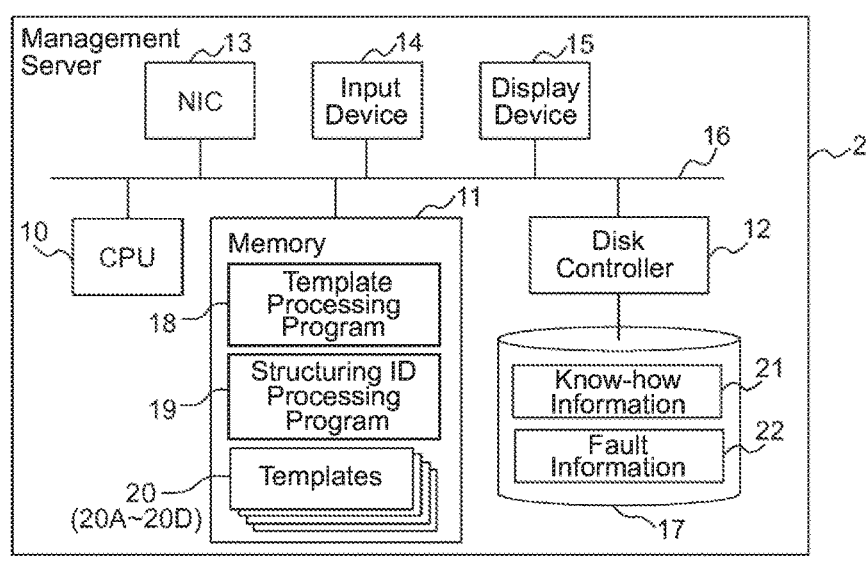
FIG. 2 is a block diagram illustrating a schematic configuration of a management server.

The management server 2 is configured as illustrated in FIG. 2 so that a CPU (Central Processing Unit) 10, a memory 11, a disk controller 12, an NIC (Network Interface Card) 13, an input device 14, and a display 15 are connected to each other via an internal bus 16 and a disk drive 17 is connected to the disk controller 12.

The CPU 10 is a processor that controls the operation of the entire management server 2. Furthermore, the memory 11 is used to store various kinds of programs, and is also used as a work memory for the CPU 10. In a case of this embodiment, the memory 11 for the management server 2 stores a template processing program 18 and a structuring ID processing program 19, which will be described later, and respective templates 20 (20A to 20D) for parameters regarding hardware, an OS 46 (FIG. 3), HA (High Availability) clustering software (hereinafter referred to as the HA software) 47 (FIG. 3), and a database management program 48 (FIG. 3) for the construction target system 3 described later with reference to FIG. 3.

The disk controller 12 is a controller having a function that controls reading/writing of data from/to the disk drive 17 in response to a request from the CPU 10. The NIC 13 performs protocol control when communicating with equipment in the construction target system 3 via a network not illustrated in the drawing.

The input device 14 is composed of, for example, a keyboard and a mouse, and is used when the system engineer 4 operates the management server 2. Furthermore, the display device 15 is configured of, for example, a liquid crystal display device, and is used to display various kinds of information.

The disk drive 17 is configured of, for example, hard disk drives and/or SSDs (Solid State Drives), and is used to store various kinds of programs and data for a long period of time. The programs and data stored in the disk drive 17 are read to the memory 11 when activating the management server 2 or whenever necessary; and processing of the management server 2 as a whole as described later is executed as the CPU 10 executes corresponding arithmetic processing and control processing according to the programs and data which have been read to the memory 11. Note that in the case of this embodiment, the disk drive 17 for the management server 2 stores know-how information 21 and fault information 22 which will be described later.

The construction target system 3 is a system which is configured by combining components of the plurality of vendors, and manages a construction target system capable of constructing a computer system with desired system specifications by setting respective values of specified parameters. Specifically speaking, the construction target system 3 is composed of one or more client terminals 30, a plurality of server systems 32 which are connected with these client terminals 30 via a network 31, and have a redundant configuration, and a storage apparatus 33 connected to each of these server systems 32.

The client terminal 30 is a computer operated by a user who uses the computer system to be built by setting parameters to the server systems 32, and is configured of, for example, a personal computer or a workstation.

Figure 3:
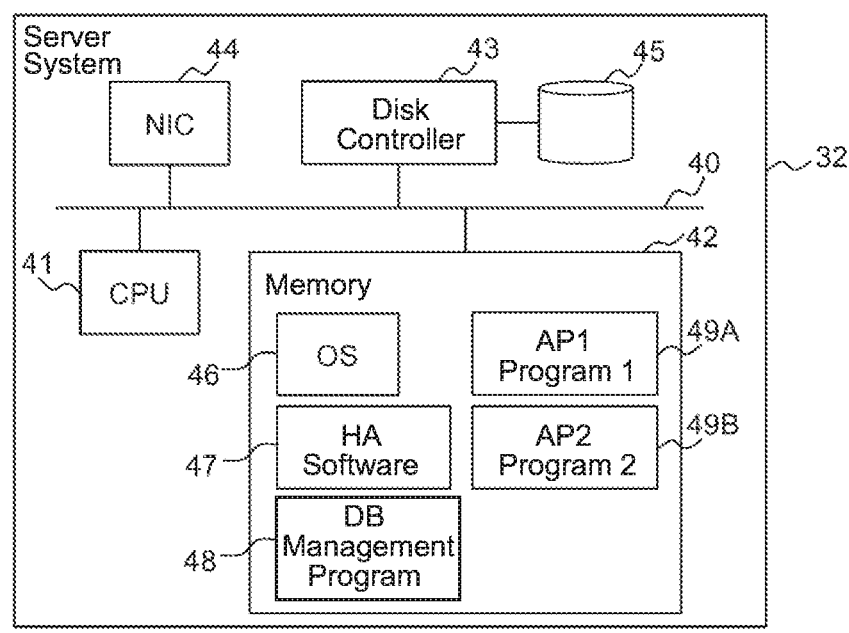
FIG. 3 is a block diagram illustrating a schematic configuration of a server system for a construction target system.

The server system 32 is a general-purpose server system that executes various kinds of arithmetic processing in response to a request from the client terminal 30, and writes data to, and reads data from, the storage apparatus 33, and is configured as illustrated in FIG. 3 by including a CPU 41, a memory 42, a disk controller 43, and an NIC 44, which are connected to each other via an internal bus 40, and a disk drive 45 connected to the disk controller 43.

The CPU 41 is a processor that controls the operation of the entire server system 32. Furthermore, the memory 42 is used to store various kinds of programs, and is also used as a work memory for the CPU 41. In the case of this embodiment, the memory 42 for the server system 32 stores the operating system (OS) 46, the HA software 47, the database management program 48, and first and second application programs 49A, 49B.

The OS 46 is software equipped with, for example, basic functions for management and control of the server system 32 and basic functions commonly used by many pieces of software; and the HA software 47 is software equipped with a function that monitors faults of the computer system (the construction target system 3), and executes processing for taking over operations to a healthy server system 32 upon occurrence of a fault. Moreover, the database management program 48 is a program having a function that manages a database built in the storage apparatus 33 (FIG. 1). Furthermore, the first and second application programs 49A, 49B are application programs for executing processing according to the content of the user operations using the client terminal 30 (FIG. 1).

The disk controller 43 is a controller having a function that controls reading/writing data from/to the disk drive 45 in response to a request from the CPU 41. The NIC 44 is an interface that performs protocol control when communicating with, for example, the management server 2 (FIG. 1) via the network 31 (FIG. 1). Furthermore, the disk drive 45 is configured of, for example, hard disk drives or SSDs, and is used to store various kinds of programs and data for a long period of time.

Note that although it is not particularly illustrated in the drawing, the server system 32 may include an input device and a display device in the same manner as the management server 2.

The storage apparatus 33 is a storage device that provides a large-capacity storage area to the server system 32, and is configured by, for example, a RAID (Redundant Arrays of Inexpensive Disks) system. The storage apparatus 33 stores data in response to a request from the server system 32, and outputs the stored data to the server system 32.

(2) Parameter Verification Function According to this Embodiment (2-1) Outlines of Parameter Verification Function Next, the outlines of the parameter verification function mounted in the management server 2 will be explained with reference to FIG. 4. In the case of this embodiment, when the system engineer 4 constructs a computer system by setting various kinds of parameters to the construction target system 3, the management server 2 is equipped with a parameter verification function that verifies whether or not the built computer system satisfies the system specifications requested by the user. Note that this parameter verification function is composed of a structuring ID function and a template function which will be explained later.

Practically, when the system engineer 4 configures the computer system with the system specifications according to the user request, the information processing system 1 according to this embodiment firstly registers values of various kinds of parameters regarding the system specifications in the management server 2 (SP1). In the following explanation, the values of the various kinds of parameters regarding three items, that is, system configuration, availability, and performance are registered as the system specifications in the management server 2.

Furthermore, the system engineer 4 sets the values of the respective parameters for each of the templates 20A to 20D (FIG. 2), which are stored in advance in the memory 42 for the management server 2 as mentioned earlier, for the hardware, the OS 46, the HA software 47, and the database management program 48 so as to make the values of the respective parameters satisfy the system specifications, by referring to a hardware manual 50A, an OS manual 50B, an HA software manual 50C, and a database manual 50D prepared by respective vendors of the hardware, the OS 46, the HA software 47, and the database management program 48 (SP2).

Meanwhile, after the values of the parameters for each template 20A to 20D are set by the system engineer 4 as described above, the management server 2 creates a logical model MDL (FIG. 7) of the computer system to be then built on the basis of the system specifications registered in step SP1 (SP3). The details of the logical model MDL will be explained later. Moreover, the management server 2 associates corresponding know-how information 21 and/or fault information 22, from among the system information 21 and the fault information 22 which are stored in the disk drive 17 in advance, with necessary nodes (component elements) of the created logical model MDL (SP4). Such functions of the management server 2 in steps SP3 and SP4 will be hereinafter referred to as the structuring ID function.

Note that the know-how information 21 is information about so-called know-how which is not a target of the system specifications, but is to be recommended when constructing the computer system. For example, information indicating that "when application software in a certain database management program is to be installed, a 4 GB memory would be sufficient to operate, but it tends to slow down response time; and, therefore, an 8 GB memory is recommended" would be such know-how information. Furthermore, the fault information 22 is information that defines handling strategies upon occurrence of a fault. For example, information indicating that "when a fault of the OS occurs, system switching should be performed" would be such fault information.

Subsequently, the management server 2 classifies the respective parameters regarding the hardware, the OS 46, the HA software 47, and the database management program 48 which are set by the system engineer 4 as described above, by each item (the system configuration, availability, and performance) of the system specifications (SP5). Furthermore, the management server 2 compares the classified parameters with the system specifications, which are registered by the system engineer 4 as mentioned earlier, of the computer system to be then built with respect to each item of the system specifications with reference to the know-how information 21 and the fault information 22, and thereby verifies whether or not the computer system to be built according to the parameters set by the system engineer 4 satisfies the system specifications according to the user request (SP6). Furthermore, the management server 2 displays the verification result obtained as a result of this verification on the display device 15 (SP7). Such functions of the management server 2 in step SP5 to step SP7 will be hereinafter referred to as the template function.

When such verification finds that the computer system to be built according to the parameters set by the system engineer 4 satisfies the system specifications, and the management server 2 receives an instruction from the system engineer 4 to set these parameters, the management server 2 sets the values of these parameters respectively to each server system 32 of the construction target system 3 (SP8).

(2-2) Details of Parameter Verification Function

Now, FIG. 5A to FIG. 5C illustrate examples of the system specifications registered in the management server 2 by the system engineer 4 in the aforementioned step SP1. In the case of this embodiment, the system specifications are composed of various kinds of parameters respectively regarding each item of the system configuration (FIG. 5A), the availability (FIG. 5B), and the performance (FIG. 5C).

Specifically speaking, the system specifications regarding the system configuration are composed, as illustrated in FIG. 5A, of respective parameters regarding: the "Number of Servers" which is the number of the server systems 32 in the computer system to be then built; a "Backup Method" which is a backup method to be applied to the computer system; "CPU," "Memory," "Disk," and "NIC" which are specifications for the CPU 41 (FIG. 3), the capacity of the memory 42 (FIG. 3), the capacity of the disk drive 45 (FIG. 3), and specifications of the NIC 44 (FIG. 3) in each server system 32 in the computer system; a "Server Name" which is a name of the corresponding server system 32; and "OS," "HA Software," and "Database (DB)" which are product names of the OS 46 (FIG. 3), the HA software 47 (FIG. 3), and the database management program 48 (FIG. 3) to be implemented in these server systems 32. FIG. 5A illustrates an example indicating that each of the following system specifications regarding the system configuration is requested: "2" as the "Number of Servers"; a "Hot Standby" method as the "Backup Method"; "4 Cores of 2 GHz" as the "CPU"; "4 GB" as the "Memory"; "1 TB" as the "Disk"; "2" NICs of "1 Gbit/s" each as the "NIC"; "BS-1" as the "Server Name"; "OS-1" as the "OS"; "HA-1" as the "HA Software"; and "DB-1" as the "Database (DB)."

Furthermore, the system specifications regarding the availability are composed of respective parameters regarding a fault(s) to be detected, a part (resource) where the fault should be detected, and maximum time required to detect the fault after the occurrence of the fault as illustrated in FIG. 5B. FIG. 5B illustrates an example indicating that the following system specifications regarding the availability are required: a fault of the server system 32 ("Server Fault") should be detected by the "HA Software" within "10 seconds"; a fault of the process ("Process Fault") should be detected by the "HA Software" within "20 seconds"; a fault of the storage apparatus 33 (FIG. 1) ("Storage Fault") should be detected by the "OS" of the server system 32 within "10 seconds"; and a fault of the network 31 (FIG. 1) ("Network Fault") should be detected similarly by the "OS" of the server system 32 within "20 seconds."

Furthermore, the system specifications regarding the performance are composed of parameters regarding targets and performance items, performance values required for its target and its performance item as illustrated in FIG. 5C. FIG. 5C illustrates an example indicating that the following system specifications regarding the performance are required: "Throughput" of the server system 32 ("Server") should be "100 TPS"; and "Response Time" should be within "5 seconds." Note that "TPS" is an abbreviation for a "Transaction Per Second," and means the capability capable of processing a transaction from the client terminal 30 (FIG. 1) per second.

Meanwhile, FIG. 6A to FIG. 6D illustrate configuration examples of the templates 20A to 20D for the hardware, the OS, the HA software, and the database to which the values of the respective parameters are set by the system engineer 4 in step SP2 mentioned earlier. FIG. 6A is a configuration example of a hardware template (hereinafter referred to as the hardware template) 20A; FIG. 6B is a configuration example of an OS template (hereinafter referred to as the OS template) 20B; FIG. 6C is a configuration example of an HA software template (hereinafter referred to as the HA software template) 20C; and FIG. 6D is a configuration example of a database template (hereinafter referred to as the DB template) 20D.

In the example of FIG. 6A, the hardware template 20A includes each of the following parameters: a "Server Name" of the server systems 32 in the computer system 32 to be then built; the "Number of Servers" which is the number of the server systems 32 to exist in the computer system; a "Backup Method" which is a backup method for the computer system; a "CPU" representing the specifications of the CPU 41 (FIG. 3) for each server system 32 existing in the computer system; a "Memory" representing the capacity of the memory 42 (FIG. 3) in these server systems 32; a "Disk" representing the capacity of the disk drive 45 (FIG. 3) in these server systems 32; an "NIC" representing the specifications for the NIC 44 (FIG. 3) in these server systems 32; and "System Availability" representing the availability of such computer system. FIG. 6A illustrates an example indicating each of the following parameters is set by the system engineer 4: "BS-1" as the "Server Name"; "2" as the "Number of Servers"; "Hot Standby" as the "Backup Method"; "2 GHz; and Number of Cores: 4" as the specifications of the "CPU"; "4 GB" as the capacity of the "Memory"; "1 TB" as the capacity of the "Disk"; "1 Gbit/s; Quantity: 2" as the "NIC"; and "99.99(%)" as the "System Availability."

Moreover, in the example of FIG. 6B, the OS template 20B includes each of the following parameters: an "OS Name" which is a type of the OS 46 (FIG. 3) to be mounted in the server systems 32 in the computer system; a "Server Monitoring Interval" which is a time interval for the OS 46 to monitor the status of the server systems 32; a "Process Monitoring Interval" which is a time interval for the OS 46 to monitor the status of the process; a "Storage Monitoring Interval" which is a time interval for the OS 46 to monitor the status of the storage apparatus 33 (FIG. 1); a "Network Monitoring Interval" which is a time interval for the OS 46 to monitor the status of the network 31 (FIG. 1); the "Number of Processes" which is the number of processes that can be executed simultaneously by the OS 46; and the "Number of Terminal Connections" which is the number of client terminals 30 that the OS 46 can deals with simultaneously. FIG. 6B illustrates an example indicating each of the following parameters is set by the system engineer 4: "OS-1" as the "OS Name"; "10 seconds" as the "Server Monitoring Interval"; "30 seconds" as the "Process Monitoring Interval"; "10 seconds" as the "Storage Monitoring Interval"; "20 seconds" as the "Network Monitoring Interval": "10" as the "Number of Processes"; and "100" as the "Number of Terminal Connections."

Furthermore, in the example of FIG. 6C, the HA software template 20C includes each of the following parameters: an "HA Software Name" which is a name of the HA software 47 (FIG. 3) to be installed in each server system 32 in the computer system; the "Number of Servers" which is the number of the server systems 32 in the computer system; a "Backup Method" which is a backup method for the computer system; a "Heartbeat Interval" which is a pulse period of a heartbeat signal exchanged between the server systems 32 in the computer system; the "Number of Heartbeats" representing how many times the pulses of the heartbeat signal are not received in order to determine that a fault has occurred at the server system 32 on a counterpart side; and a "Process Monitoring Interval" which is a time interval for the HA software 47 to monitor the process. FIG. 6C illustrates an example indicating that each of the following parameters is set by the system engineer 4: "HA-1" as the "HA Software Name"; "2" as the "Number of Servers"; "Hot Standby" as the "Backup Method"; "3 seconds" as the "Heartbeat Interval"; "3" as the "Number of Heartbeats"; and "20 seconds" as the "Process Monitoring Interval."

Furthermore, in the case of the example of FIG. 6D, the database template 20D includes each of the following parameters: a "Database (DB) Name" which is a name of a database created in the computer system; the "Number of Servers" which is the number of the server systems 32 that use the database in the computer system; "Process Monitoring Time" which is a time interval for the database management program 48 (FIG. 3) to monitor the process; and a "Buffer Size" which is a buffer size for the database. FIG. 6D illustrates an example indicating that each of the following parameters is set by the system engineer 4: "DB-1" as the "Database Name"; "2" as the "Number of Servers"; "30 seconds" as the "Process Monitoring Interval"; and "500 MB" as the "Buffer Size."

Figure 4:
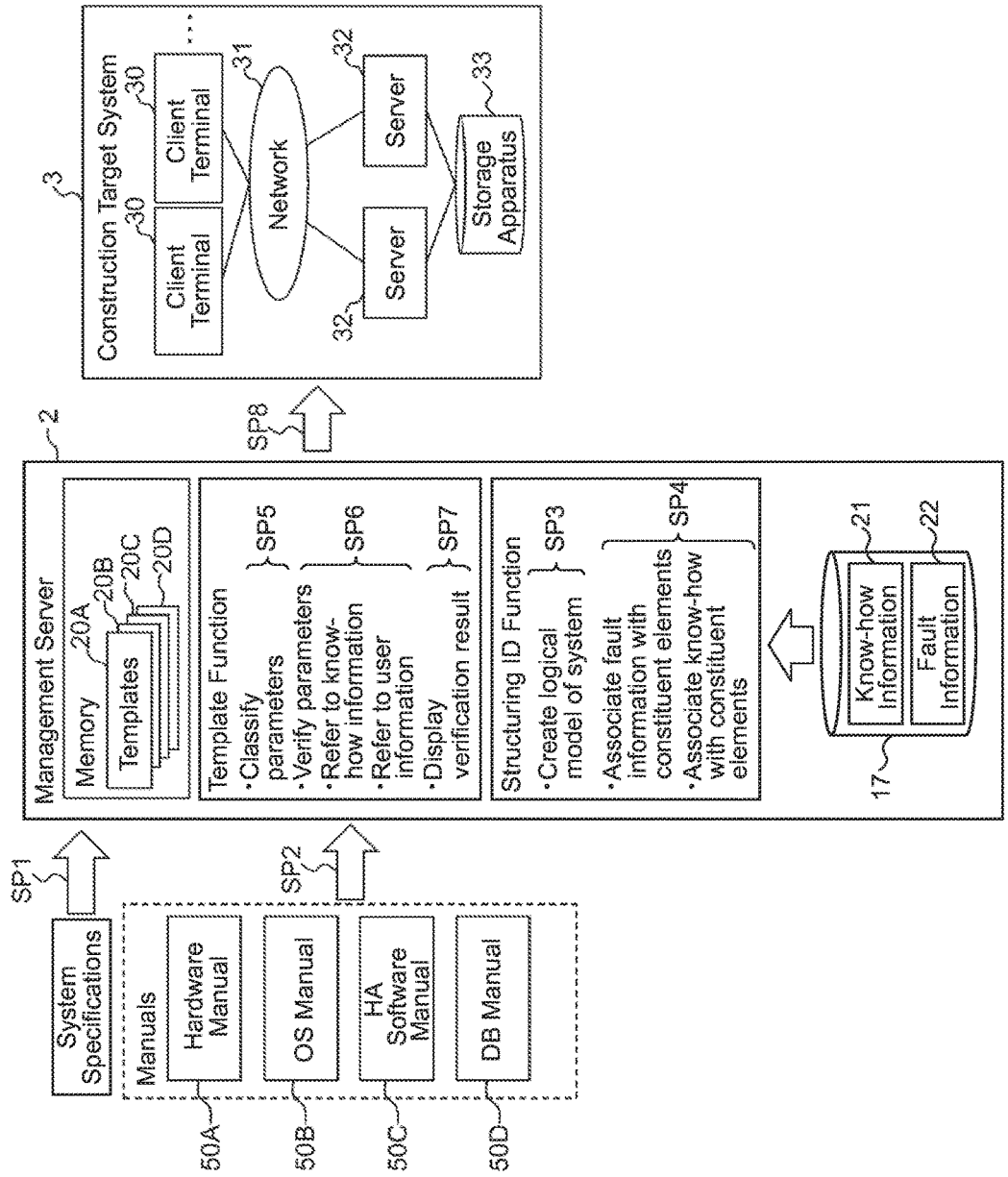
FIG. 4 is a conceptual diagram for explaining a parameter verification function according to this embodiment.

Meanwhile, FIG. 7 illustrates a configuration example of a logical model MDL, which is created by the management server 2 in step SP3 of FIG. 4, of the computer system to be built by the system engineer 4 setting each of the parameters to the construction target system 3.

This logical model MDL is a model that expresses the configuration of the computer system by using a hierarchical tree structure as illustrated in FIG. 7. In a case of an example of FIG. 7, node n1 that is "System" representing the entire computer system is an apex and nodes n2 to n4 that are "Network," "Storage," "Server," etc. respectively representing the network 31 (FIG. 1), the storage apparatus 33 (FIG. 1), the server system 32, etc. which constitute the computer system are connected to this node n1.

Moreover, the node n4 that is the "Server" is connected to two nodes n5, n6 that are "Hardware" and "Software" which represent the hardware and the software for the server system 32, respectively; the node n5 that is "Hardware" is connected to nodes n7, n8, n9, etc. that are "CPU," "Memory," "NIC," etc. respectively representing the CPU 41 (FIG. 3), the memory 42, the NIC 44 (FIG. 3), etc. which are the hardware constituting the server system 32; and the node n6 that is the "Software" is connected to nodes n10, n11, n12, etc. that are "OS," "HA software," "DB," etc. respectively representing the OS 46 (FIG. 3), the HA software 47 (FIG. 3), the database management program 48 (FIG. 3), etc. which are the software mounted in the server system 32.

The management server 2 connects the corresponding know-how information 21 and/or fault information 22, from among the various kinds of know-how information 21 (FIG. 2) and the various kinds of fault information 22 (FIG. 2) which are registered in the disk drive 17 (FIG. 2) in advance as described earlier, to necessary nodes n7 to n12, etc. of the logical model MDL created as described above in step SP4 of FIG. 4.

Now, the know-how information 21 according to this embodiment is composed of first know-how information 21A (FIG. 8A) which is know-how about the system construction and availability and second know-how information 21B (FIG. 8B) which is know-how about performance management as illustrated in FIG. 8. For example, the first know-how information 21A illustrated in an upper part of FIG. 8A indicates that "when 'Process Monitoring' is performed by the HA software called 'HA-1,' the time interval of the 'Process Monitoring' should not be 'Equal to or Less Than Heartbeat Interval'; and the first know-how information 21A illustrated in a lower part of FIG. 8A indicates that "when the database management program called 'DB-1' is to be installed, '8 GB' is recommended as the capacity of the 'Memory.'"

Moreover, the second know-how information 21B illustrated in FIG. 8B expresses the relationship between the buffer size and the throughput and response time regarding processing executed by the database management program 48 (FIG. 3). For example, it is shown that when the buffer size of the server system 32 of the computer system is "100 MB," the throughput is "500 TPS" and the response time is "10 seconds"; when the buffer size is "500 MB," the throughput is "100 TPS" and the response time is "5 seconds"; and when the buffer size is "1000 MB," the throughput is "100 TPS," but the response time can be reduced to "2 seconds." Note that the "Buffer Size" herein used means the capacity that can be used as a buffer among the capacity of the memory 42 (FIG. 3) for the server system 32.

Furthermore, the fault information illustrated in FIG. 9 indicates that when a fault occurs in the "OS" or when a fault occurs in the "database management program (DB)," "System Switching (failover)" should be performed in either case. Note that "System Switching" means to switch the processing to another server system 32 when a fault occurs in one server system 32.

After the management server 2 generates the logical model MDL of the computer system to be then built as described above, the management server 2 associates each piece of the know-how information 21 and each piece of the fault information 22 with the corresponding nodes (constituent elements) in the logical model MDL. For example, the first know-how information 21A in an upper row of FIG. 8A is the know-how information regarding the HA software 47 (FIG. 3) which is "HA-1," so that the management server 2 associates it with the node n11 which is the "HA software" in FIG. 7; and the first know-how information 21A in a lower row of FIG. 8A is the know-how information regarding the database management program 48 (FIG. 3) which is "DB-1," so that the management server 2 associates it with the node n12 which is the "DB" in FIG. 7. Furthermore, the second know-how information 21B illustrated in FIG. 8B is the know-how information regarding the database, so that the management server 2 associates it with the node which is the "DB (database)" in FIG. 7. Furthermore, the fault information 22 illustrated in an upper row of FIG. 9 is the fault information related to the OS 46 (FIG. 3), so that the management server 2 associates it with the node n10 which is the "OS" in FIG. 7; and the fault information 22 illustrated in a lower row of FIG. 9 is the fault information related to the database management program 48, so that the management server 2 associates it with the node n12 which is the "DB" in FIG. 7.

Note that in the case of this embodiment, when the management server 2 displays the logical model MDL of the computer system created as described above in response to a request from, for example, the system engineer 4, the management server 2 displays the logical model MDL not in the form illustrated in FIG. 7, but in a form in which the individual constituent elements (the individual nodes n1, n2, etc. in the drawing) of the computer system are expressed as, for example, character strings as illustrated in FIG. 10A to FIG. 10E-2.

Specifically speaking, the individual constituent elements are displayed, for example, in a form as illustrated in FIG. 10A where the constituent elements are connected with "." from the highest-rank (the node n1 which is the "System") to its constituent elements (the nodes n2, n3, etc.) sequentially from the high rank to the lower ranks of the tree structure as illustrated in FIG. 7. Furthermore, the fault information 22 is displayed, for example, in a form as illustrated in FIG. 10O where ":" is used to connect to the end of the character string representing the constituent elements expressed as described above; and the know-how information 21 is displayed, for example, in a form as illustrated in FIG. 10B where ";" is used to connect to the end of the character string representing the constituent elements expressed as described above (when the fault information 22 is connected, the know-how information 21 is connected after the fault information 22).

For example, FIG. 10A expresses the node n7 which is the "CPU" in FIG. 7 as an example of the display form of the constituent element (node) which is not associated with the know-how information 21 or the fault information 22 in FIG. 7. Furthermore, FIG. 10B displays the node n11 which is the "HA software" in FIG. 7 and the know-how information 21 which is "know-how information 1" associated with this node, as an example of the display form of the constituent element (node) and the know-how information 21 associated to this constituent element; and FIG. 100 expresses the node n10 which is the "OS" in FIG. 7 and the fault information 22 which is "fault information 1" associated with this node, as an example of the display form of the constituent element (node) and the fault information 22 associated to this constituent element.

Furthermore, FIG. 10D expresses the node n12 which is the "DB" in FIG. 7, and the fault information 22 that is "fault information 2" and the know-how information 21 that is "know-how information 2," which are associated with this node, as an example of the display form of the constituent element (node) and the know-how information 21 and the fault information 22 which are associated with this constituent element.

FIG. 10E-1 and FIG. 10E-2 illustrate display examples of the details of the know-how information 21. FIG. 10E-1 is a display example of the details of the know-how information 21 which is the "know-how information 1 (knowhow-info-1)" in FIG. 7; and indicates that when monitoring the process ("mon_process"), it is recommended that processing monitoring time of the HA software 47 (FIG. 3) which is "HA-1" should not be equal to or less than a heartbeat interval ("LT (heartbeat)"). Furthermore, FIG. 10E-2 is a display example of the details of the know-how information 21 which is the "know-how information 2 (knowhow-info-2)" in FIG. 7; and indicates that regarding the database management program 48 (FIG. 3) which is "DB-2," "8 GB" is recommended as the capacity of the memory 42 ("mem").

Furthermore, FIG. 10E-1 and FIG. 10E-2 illustrate display examples of the details of the fault information 22. FIG. 10E-1 is a display example of the details of the fault information 22 which is the "fault information 1 (fault-info-1)" in FIG. 7; and indicates that fault recovery processing ("recovery") is system switching ("failover"). Furthermore, FIG. 10E-2 is a display example of the details of the fault information 22 which is the "fault information 2 (fault-info-2)" in FIG. 7; and indicates, in the same manner as the "fault information 1," that the fault recovery processing ("recovery") is system switching ("failover").

After terminating the processing up to step SP4 of FIG. 4 as described above, the management server 2 associates the respective parameters regarding the hardware, the OS 46, the HA software 47, and the database management program 48, which are set by the system engineer 4 in step SP2, with the respective items (the system configuration, availability, and performance) of the system specifications, classifies the parameters into a plurality of groups by gathering the parameters related to the corresponding items, and creates tables in which the values of the corresponding parameters are listed (hereinafter referred to as the parameter tables) with respect to each item in the following step SP5.

FIG. 11A to FIG. 11C illustrate configuration examples of such parameter tables 60A to 60C. FIG. 11A is a parameter table 60A regarding the system configuration of such computer system; and FIG. 11B is a parameter table 60B regarding the availability of such computer system. Furthermore, FIG. 11C is a parameter table 60C regarding the performance of such computer system.

Referring to FIG. 11A, the parameter table 60A regarding the system configuration of the computer system is configured by including: respective columns of "Hardware," "OS," "HA Software," and "DB" respectively associated with the hardware, the OS 46 (FIG. 3), the HA software 47 (FIG. 3), and the database management program 48 (FIG. 3); and rows respectively associated with the following parameters: an "Applied Product" which represents a product name of a product applied to the computer system to be then built; a "Backup Method" which represents a backup method for the computer system; the "Number of Servers" which represents the number of the server systems 32 in the computer system; "CPU," "Memory," "Disk," and "NIC" which respectively represent the specifications of the CPU 41 (FIG. 3), the capacity of the memory 42 (FIG. 3), the capacity of the disk drive 45 (FIG. 3), and the specifications of the NIC 44 (FIG. 3) which are used in the server systems 32; and "System Availability" representing the availability of the computer system.

Moreover, referring to FIG. 11B, the parameter table 60B regarding the availability of the computer system is configured by including respective columns of "Hardware," "OS," "HA Software," and "DB" respectively associated with the hardware, the OS 46, the HA software 47, and the database management program 48; and rows respectively associated with a fault of the server system 32 ("Server Fault"), a fault of the process ("Process Fault"), a fault of the storage apparatus 33 (FIG. 1) ("Storage Fault"), and a fault of the network 31 (FIG. 1) ("Network Fault").

Furthermore, referring to FIG. 11C, the parameter table 60C regarding the performance of the computer system is configured by including respective columns of "Hardware," "OS," "HA Software," and "DB" respectively associated with the hardware, the OS 46, the HA software 47, and the database management program 48; and respective rows for "Throughput" and "Response Time" respectively associated with the throughput and the response time of the server system 32.

Each field of these parameter tables 60A to 60C stores the values of the corresponding parameters from among the parameters which are set by the system engineer 4 by using the hardware template 20A, the OS template 20B, the HA software template 20C, and the database template 20D in step SP2 of FIG. 4. In this case, if no corresponding parameter exists, information indicating to that effect ("-") is stored in each field of such parameter tables 60A to 60C.

After creating each parameter table 60A to 60C regarding the system configuration, availability, and performance of the computer system in this manner, the management server 2 compares these parameter tables 60A to 60C with the system specifications, which are registered by the system engineer 4 in step SP1, of the computer system to be then built with reference to the know-how information 21 and the fault information 22 and verifies whether or not the computer system to be built according to the parameters set by the system engineer 4 satisfies the system specifications requested by the user, in step SP6 of FIG. 4.

Specifically speaking, the management server 2 compares the parameter table 60A regarding the system configuration, which is created as described above in step SP5 of FIG. 4, with the system specifications regarding the system configuration registered by the system engineer 4 in step SP1 of FIG. 4, with respect to each element of the system specifications and determines whether the computer system satisfies the system specifications regarding the system configuration or not, as illustrated in FIG. 12.

For example, in a case of an example in FIG. 12, regarding the system specifications regarding the system configuration, "2" is requested as the number of the server systems 32 in the computer system to be then built and "Hot Standby" is requested as the backup method (see the table in a lower part of FIG. 12); and the number of the server systems 32 in the computer system to be built according to the parameters set by the system engineer 4 is "2" and the backup method is "Hot Standby" (see the parameter table 60A in an upper part of FIG. 12). So, you can see that the computer system satisfies the system specifications according to the user request with respect to these parameters.

Moreover, in a case of the example in FIG. 12, regarding the system specifications regarding the system configuration, "2 GHz; and Quantity: 4" is requested for the specifications of the CPU 41 (FIG. 3), "4 GB" is requested for the capacity of the memory 42 (FIG. 3), "1 TB" is requested for the capacity of the disk drive 45 (FIG. 3), and "1 Gbit/s; and Quantity: 2" is requested for the specifications of the NIC 44 (FIG. 3) as the hardware of the server systems 32 in the computer system (see the table in the lower part of FIG. 12); and the specifications of the CPU 41 for the server systems 32 in the computer system as set by the system engineer 4 are "2 GHz; and the Number of Cores: 4," the capacity of the memory 42 is "4 GB," the capacity of the disk drive 45 is "1 TB," and the specifications of the NIC 44 are "1 Gbit/s; and Quantity: 2" (see the parameter table 60A in the upper part of FIG. 12). So, you can see that the computer system satisfies the system specifications according to the user request with respect to these parameters.

Furthermore, in a case of the example in FIG. 12, regarding the system specifications regarding the system configuration, "OS-1" is requested for the OS, "HA-1" is requested for the HA software, and "DB-1" is requested for the database management program ("DB") as the software to be mounted in the server systems 32 in the computer system (see the table in the lower part of FIG. 12); and the OS 48 (FIG. 3) which is mounted in the server systems 32 in the computer system set by the system engineer 4 is "OS-1," the HA software 47 (FIG. 3) is "HA-1," and the database management program 48 (FIG. 3) is "DB-1" (see the parameter table 60A in the upper part of FIG. 12). So, you can see that the computer system satisfies the system specifications according to the user request with respect to these parameters.

As a result, the management server 2 determines that the computer system satisfies the system specifications regarding the system configuration.

Note that in the above explanation, no reference is made to the know-how information 21 or the fault information 22; however, regarding the items of the system specifications corresponding to the nodes associated with the know-how information 21 and the fault information 22 in the logical model MDL described earlier with reference to FIG. 7, the management server 2 refers to the know-how information 21 and the fault information 22 in order to compare the parameter table 60A regarding the system configuration with the system specifications regarding the system configuration and determine whether the computer system satisfies the system specifications regarding the system configuration or not.

Moreover, as illustrated in FIG. 13, the management server 2 compares the parameter table 60B regarding the availability, which is created in step SP5 of FIG. 4 as described above, with the system specifications regarding the availability, which is registered by the system engineer 4 in step SP1 of FIG. 4, with respect to each element of the system specifications regarding individual faults and determines whether the computer system to be built according to the parameters set by the system engineer 4 satisfies the system specifications regarding the availability or not.

For example, in a case of the example in FIG. 13, regarding the system specifications regarding the availability, it is required that with the computer system to be then built, a fault of the server system 32 ("Server Fault") should be detected by the "HA software" within "10 seconds" (see the table in a lower part of FIG. 13); and with the computer system, the server fault is detected by the "OS" within "30 seconds" and by the "HA Software" within "10 seconds" (see the parameter table 60B in an upper part of FIG. 13). As a result, the "HA software" detects the server fault within "10 seconds," so that you can see that the computer system satisfies the system specifications according to the user request with respect to this item.

Moreover, regarding the system specifications regarding the availability, it is required that with such computer system, a fault of process processing ("Process Fault") should be detected by the "HA software" within "20 seconds" (see the table in the lower part of FIG. 13); and with the computer system, the process fault is detected by the "OS" within "30 seconds" and by the "HA Software" within "20 seconds" (see the parameter table 60B in the upper part of FIG. 13). As a result, the "HA software" detects the process fault within "20 seconds," so that you can see that the computer system satisfies the system specifications according to the user request also with respect to this item.

Furthermore, regarding the system specifications regarding the availability, it is required that with such computer system, a fault of the storage apparatus 33 (FIG. 1) ("Storage Fault") should be detected by the "OS" within "10 seconds" (see the table in the lower part of FIG. 13); and with the computer system, the disk fault is detected by the "OS" within "10 seconds" (see the parameter table 60B in the upper part of FIG. 13), so that you can see that the computer system satisfies the system specifications according to the user request also with respect to this item.

Furthermore, regarding the system specifications regarding the availability, it is required that with such computer system, a fault of the network 31 (FIG. 1) ("Network Fault") should be detected by the "OS" within "20 seconds" (see the table in the lower part of FIG. 13); and with the computer system, the network fault is detected by the "OS" within "20 seconds" and by the "DB (the database management program)" within "30 seconds" (see the parameter table 60B in the upper part of FIG. 13). As a result, the "OS" detects the network fault within "20 seconds", so that you can see that the computer system satisfies the system specifications according to the user request also with respect to this item.

As a result, the management server 2 determines that the computer system satisfies the system specifications regarding the availability.

Note that no reference is made to the know-how information 21 or the fault information 22 in the above explanation in the same manner as in the aforementioned case of the system specifications regarding the system configuration; however, regarding the items of the system specifications corresponding to the nodes associated with the know-how information 21 and the fault information 22 in the logical model MDL described earlier with reference to FIG. 7, the management server 2 refers to the know-how information 21 and the fault information 22 in order to compare the parameter table 60B regarding the availability with the system specifications regarding the availability and determine whether or not the computer system satisfies the system specifications regarding the availability.

Meanwhile, regarding the performance of the computer system to be built according to the parameters set by the system engineer 4, the management server 2 uses the know-how information 21 as illustrated in FIG. 14 to determine whether or not the computer system satisfies the system specifications regarding the performance.

For example, in a case of an example in FIG. 14, regarding the system specifications regarding the performance, it is required that with the computer system to be then built, the "Throughput" of the server system 32 (the "Server") should be "100 TPS" and the "Response Time" should be within "5 seconds" (see the table in the lower part of FIG. 14); and with the computer system, the capacity of the memory 42 (FIG. 3) is "4 GB" as is apparent from FIG. 11A and, therefore, the computer system has the performance with the "Throughput" being "100 TPS" and the capability to respond within "2 seconds" as the "Response Time" (see the table in the upper part of FIG. 14). So, the management server 2 determines that the computer system satisfies the system specifications regarding the performance.

Note that the parameter table 60C regarding the performance created in step SP5 of FIG. 4 is not used in the above explanation; however, the management server 2 compares the parameter table 60C with the system specifications regarding the performance, which are registered by the system engineer in step SP1 of FIG. 4, with respect to each element of the individual system specifications, as necessary, and determines whether or not the computer system to be built according to the parameters set by the system engineer 4 satisfies the system specifications regarding the performance. Furthermore, no reference is made to the fault information 22 in the above explanation; however, regarding the elements of the system specifications corresponding to the nodes associated with the fault information 22 in the logical model MDL described earlier with reference to FIG. 7, the management server 2 refers to this fault information 22 in order to compare the parameter table 60C regarding the performance with the system specifications regarding the performance and determines whether or not the computer system satisfies the system specifications regarding the performance.

Figure 15:
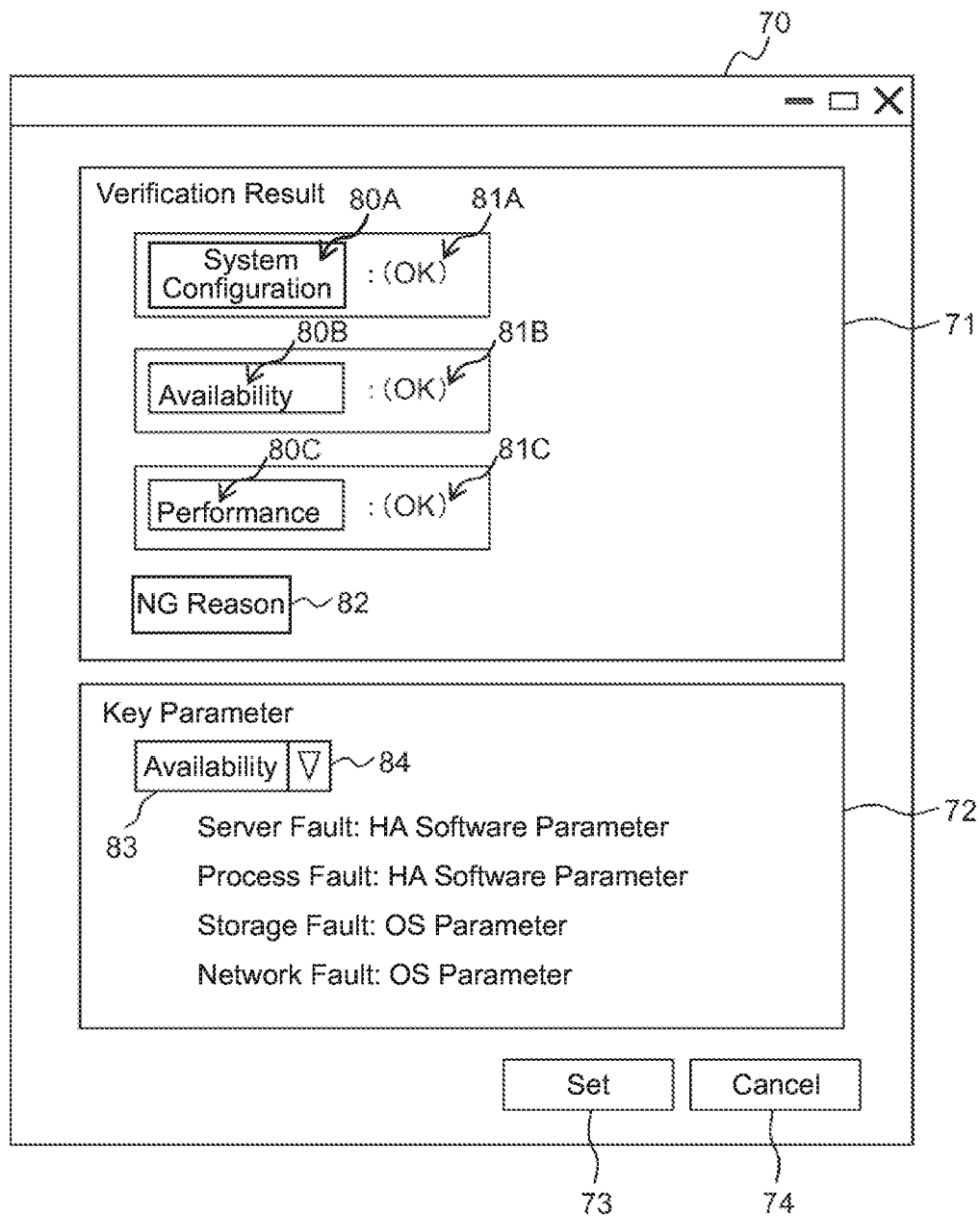
FIG. 15 is a schematic diagram schematically illustrating an example of a screen configuration of a verification result display screen.

Meanwhile, FIG. 15 illustrates a verification result display screen 70 displayed on the display device 15 (FIG. 2) of the management server 2 in step SP7 of FIG. 4. This verification result display screen 70 is a screen to display verification results indicating whether or not the computer system to be built according to each of the parameters set by the system engineer 4 as described above satisfies the system specifications according to the user request.

This verification result display screen 70 is configured by including a verification result display area 71 and a key parameter display area 72 as is apparent from FIG. 15.

The verification result display area 71 displays, with respect to each item of the system specifications (the system configuration, availability, and performance), character strings 80A to 80C which represent the names of such items and character strings 81A to 81C which represent the verification results of the items. Specifically speaking, regarding the verification results, when the computer system to be built according to the parameters set by the system engineer 4 satisfies the system specifications with respect to the corresponding item, the character string "OK" is displayed; and when the computer system does not satisfy the system specifications with respect to the corresponding item, the character string "NG" is displayed.

Moreover, when any item for which the character string "NG" is displayed as the verification result (any item which does not satisfy the system specifications) exists, a specific reason for the evaluation of "NG" for that item (a specific reason for the determination that the item does not satisfy the system specifications) is displayed in an NG reason display area 82 provided at the bottom part in the verification result display area 71.

Meanwhile, an item display field 83 and a pull-down button 84 are displayed in the key parameter display area 72. In the verification result display screen 70, the name of the then-selected item can be displayed in the item display field 83 and a key parameter for each element of that item can be displayed in each key parameter display area 72 by selecting a desired item from each item of the system specifications (the system configuration, availability, and performance) indicated in a pull-down menu (not shown) which is displayed by clicking the pull-down button 84.

Note that the key parameter(s) means a parameter(s) which is directly related to or influences the system specifications. For example, in a case of the availability, parameters for the HA software 47 (FIG. 3) are key parameters with respect to the items such as the server fault and the process fault; and parameters for the OS 46 (FIG. 3) are key parameters with respect to the storage fault and the network fault. FIG. 15 illustrates an example in which the "availability" is selected as the item of the system specifications, key parameters for each of four items, so that the "Server Fault," the "Process Fault," the "Storage Fault," and the "Network Fault" are displayed.

Meanwhile, a setting button 73 and a cancel button 74 are displayed in a lower right part of the key parameter display area 72 on the verification result display screen 70. The setting button 73 is a button to transmit the values of the parameters which are respectively set by the system engineer 4 to the system template 20A (FIG. 6A), the OS template 20B (FIG. 6B), the HA software template 20C (FIG. 6C), and the DB template 20D (FIG. 6D) in step SP2 of FIG. 4, together with a setting instruction to each server system 32 of the construction target system 3 (FIG. 1); and the cancel button 74 is a button to close this verification result display screen 70 without transmitting such parameters to each server system 32.

Consequently, when all the verification results of each item of the system specifications displayed in the verification result display area 71 on the verification result display screen 70 are "OK," the system engineer 4 clicks the setting button 73. As a result, the value of each parameter, which is set by the system engineer 4 in step SP2 of FIG. 4, can be set to each server system 32 of the construction target system 3 (FIG. 1). Furthermore, when any of the verification results of each item of the system specifications displayed in the verification result display area 71 on the verification result display screen 70 is "NG," the system engineer 4 checks the NG reason displayed in the NG reason display area 82 of the verification result display area 71 and then clicks the cancel button 74. As a result, the system engineer 4 can close the verification result display screen 70 and set the parameters again.

(2-3) Processing Content of CPU Regarding Parameter Verification Function

Figure 16:
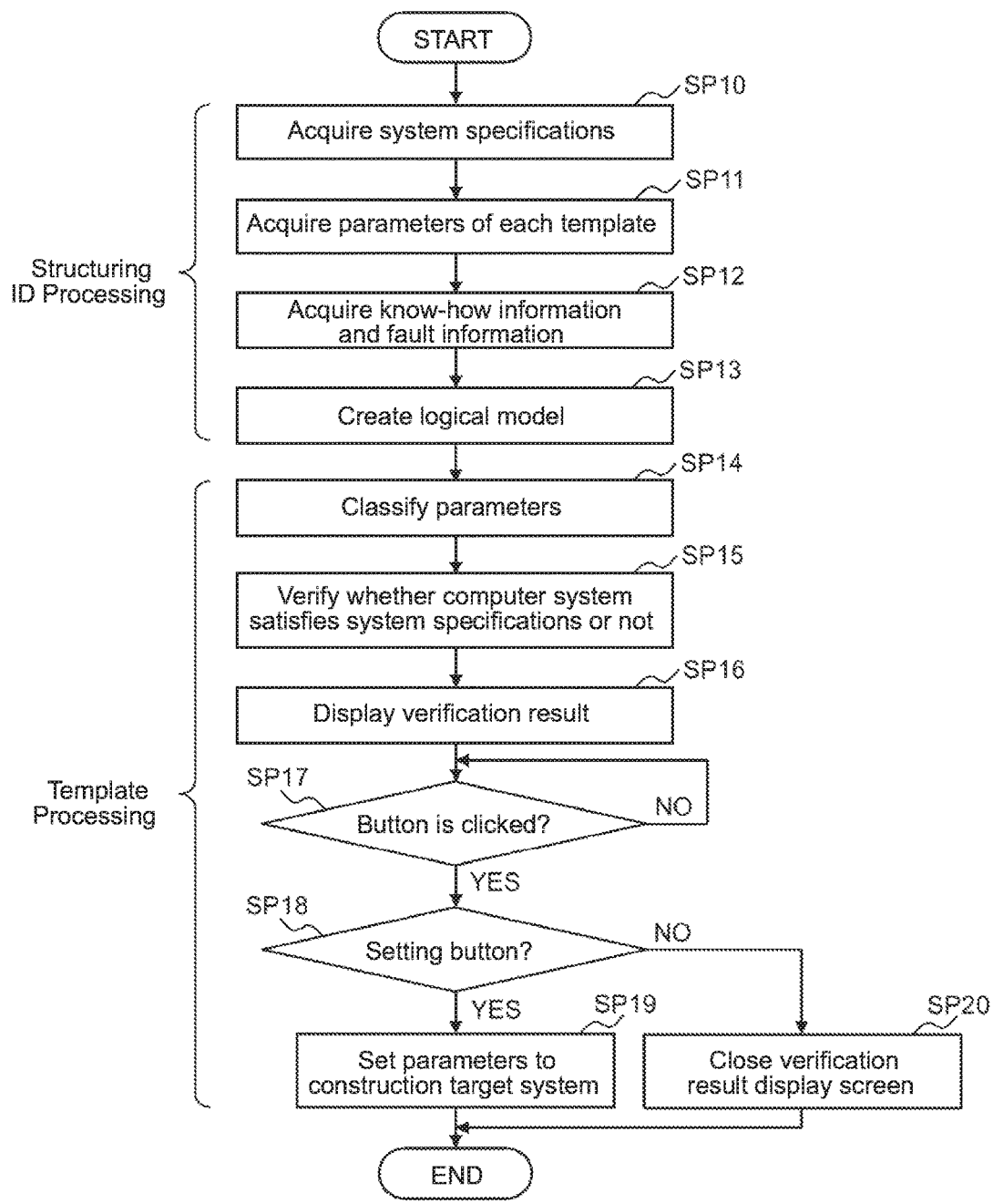
FIG. 16 is a flowchart illustrating a series of processing sequence for the parameter verification processing.

FIG. 16 illustrates a flow of series of processing executed by the CPU 10 (FIG. 2) for the management server 2 in relation with the parameter verification function according to this embodiment as described above. Referring to FIG. 16, step SP10 to step SP13 are structuring ID processing executed according to the structuring ID processing program 19 (FIG. 2) stored in the memory 11 for the management server 2 (FIG. 2) and step SP14 to step SP20 are template processing executed according to the template processing program 18 (FIG. 2) stored in the memory 11. Specifically speaking, the CPU 10 executes the series of processing regarding the parameter verification function illustrated in FIG. 16 according to the template processing program 18 and the structuring ID processing program 19.

Practically, when the structuring ID processing program 19 is activated, the CPU 10 starts the parameter verification processing illustrated in FIG. 16; and when the values of the respective parameters regarding the system specifications of the computer system to be then built are input by the system engineer 4, the CPU 10 firstly acquires them (SP10).

Subsequently, when the values of the parameters for the system template 20A (FIG. 6A), the OS template 20B (FIG. 6B), the HA software template 20C (FIG. 6C), and the DB template 20D (FIG. 6D) are set respectively by the system engineer 4, the CPU 10 acquires them (SP11). Furthermore, the CPU 10 acquires the know-how information 21 and the fault information 22 which are stored in the disk drive 17 (FIG. 2) (SP12).

The CPU 10 creates a logical model MDL (FIG. 7) of the computer system to be then built according to the respective parameters regarding the system specifications which are acquired in step SP10 (SP13). Under this circumstance, the CPU 10 associates the know-how information 21 and the fault information 22 with necessary nodes of the created logical model MDL.

Subsequently, the CPU 10 creates the parameter tables 60A to 60C (FIG. 11) for the respective items of the system specifications by classifying the parameters whose values are acquired in step SP11 into the respective items of the system specifications (SP14). Furthermore, the CPU 10 compares the values of the respective parameters stored in the parameter tables 60A to 60C created in step SP14 with the values of the respective parameters for the system specifications which are acquired in step SP10 by referring to the corresponding know-how information 21 and fault information 22 as necessary and thereby verifies whether or not the computer system to be then built according to the respective parameters set by the system engineer 4 satisfies the system specifications (SP15).

Next, the CPU 10 displays the verification result display screen 70 (FIG. 15), in which a processing result of the verification processing executed in step SP15 is indicated, on the display device 15 (FIG. 2) (SP16) and then waits for the setting button 73 or the cancel button 74 on the verification result display screen 70 to be clicked (SP17). When either the setting button 73 or the cancel button 74 is eventually clicked, the CPU 10 determines whether the then clicked button is the setting button 73 or not (SP18).

When the CPU 10 obtains an affirmative result in this determination, the CPU 10 transmits the values of the respective parameters which are acquired in step SP11 and are then set to by the system engineer 4 to the system template 20A, the OS template 20B, the HA software template 20C, and the DB template 20D, respectively, together with a setting instruction to the server system 32 for the construction target system 3 (FIG. 1) and thereby sets the values of these parameters to the server system 32 (SP19); and, furthermore, after closing the verification result display screen 70, the CPU 10 terminates this series of parameter verification processing.

On the other hand, when the CPU 10 obtains a negative result in the determination of step SP18, the CPU closes the verification result display screen 70 without transmitting the values of the respective parameters which are acquired in step SP11 and are then set to by the system engineer 4 to the system template 20A, the OS template 20B, the HA software template 20C, and the DB template 20D, respectively, to the server system 32 of the construction target system 3 (SP20); and then the CPU 10 terminates this series of parameter verification processing.

(2-4) Application to Cloud Computing System

Figure 17:
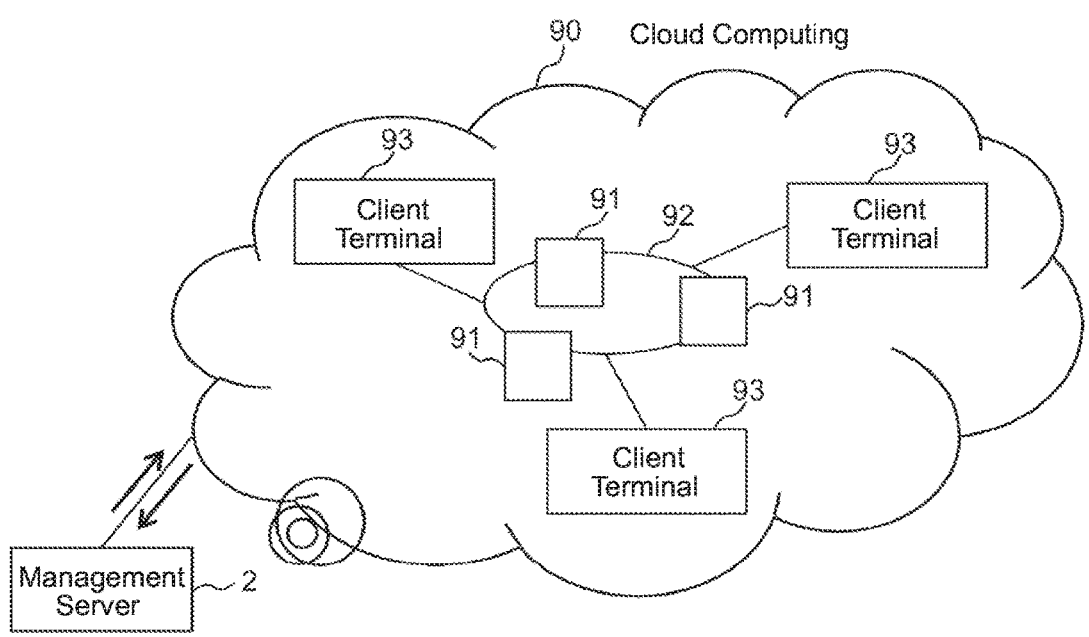
FIG. 17 is a conceptual diagram for explaining application of the present invention to a cloud computing system.

Referring to FIG. 17, a cloud computing system 90 is a technique that connects many server systems 91 via a network 92 and shows these server systems 91 to a client terminal 93 as if they were a single computer system. The present invention can be also applied to such cloud computing system 90.

Furthermore, the cloud computing system 90 can construct a virtualization system by virtualizing the server systems 91; and in this case too, it is possible to compare and verify system specifications of the virtualization system requested by the user with values of the respective parameters actually set by the system engineer 4 in the same manner as described earlier.

(3) Advantageous Effects of this Embodiment

When the information processing system 1 according to this embodiment described above is used, the system engineer 4 can easily determine whether there is any setting mistake or not, on the basis of the verification results displayed on the management server 2. Therefore, this information processing system 1 can effectively prevent the occurrence of a material fault which might lead to a system halt due to a human setting mistake.

(4) Other Embodiments

Note that the above-mentioned embodiment has described a case where the present invention is applied to the management server 2 for managing the construction target system 3 configured as illustrated in FIG. 1; however, the present invention is not limited to this example and, in short, the present invention can be widely applied to a management apparatus configured by combining components of a plurality of vendors, for managing a construction target system capable of constructing a computer system with desired system specifications by setting respective values of specified parameters.

Furthermore, the aforementioned embodiment has described a case where three items, that is, the system configuration, availability, and performance are applied as items of the system specifications; however, the present invention is not limited to this example and other items may be applied in addition to these items or instead of some or all of these items.

INDUSTRIAL AVAILABILITY

The present invention can be applied to a management apparatus for managing a construction target system capable of constructing a computer system with desired system specifications by setting respective values of specified parameters.

REFERENCE SIGNS LIST

1: information processing system
2: management server
3: configuration target system
4: system engineer
10: CPU
15: display device
18: template processing program
19: structuring ID processing program
20, 20A to 20D: templates
21: know-how information
22: fault information
32, 91: server systems
50A to 50D: manuals
MDL: logical model
60A to 60C: parameter tables
70: verification result display screen
90: cloud computing system

The invention claimed is:

1. A management apparatus for managing a construction target system configured to construct a computer system with desired system specifications by combining components and setting, for each of the components, values of specified parameters, the management apparatus comprising:
a memory that stores a plurality of templates prepared in advance, wherein the plurality of templates respectively correspond to a plurality of components and each of the plurality of templates is designed to set values of parameters regarding the component to which the parameters corresponds, and that stores know-how information which is information to be recommended when constructing the computer system, and fault information which defines a handling strategy upon occurrence of a fault;
a processor that is programmed to
create a logical model of the computer system with required system specifications which comprises multiple elements respectively corresponding to multiple components of the computer system among the plurality of components;
set the values of the parameters in multiple templates corresponding to the multiple components, to item templates which are respectively prepared for items of the system specifications,
as for each of the values of the parameters in each of the item templates, compare the value of the parameter for the required system specifications with the value of the parameter in the item template by referring to the know-how information or the fault information or the know-how information and fault information which is associated with the element corresponding to the component to which the parameter corresponds, thereby verifying whether or not the computer system to be built according to the values the parameters in the item templates satisfies the required system specifications, and
set the values of the parameters in the item templates for which the computer system satisfies the required system specifications based on a result of the verification.

2. The management apparatus according to claim 1,
wherein the processor is programmed to associate the know-how information, and the know-how information or the fault information or the know-how information and the fault information which is relevant upon occurrence of the fault, with a necessary node of the created logical model; and
wherein the processor is programmed to verify whether the computer system to be built according to each of the parameters whose respective values are set to each of the templates satisfies the required system specifications or not, by referring to the know-how information and the fault information.

3. The management apparatus according to claim 1,
wherein the processor is programmed to display the verification result for each item of the system specifications.

4. The management apparatus according to claim 3,
wherein when the computer system to be built according to each of the parameters whose respective values are set to each of the templates does not satisfy the required system specifications, the processor is programmed to display a reason why the computer system does not satisfy the system specifications.

5. The management apparatus according to claim 4,
wherein the processor is programmed to display a parameter which is directly related to or influences the system specifications as a key parameter.

6. The management apparatus according to claim 1,
wherein, based on the result of the verification, the values the parameters in the item templates that are set are to be used to build the computer system that satisfies the required system specifications.

7. A management method executed by a management apparatus for managing a construction target system that is configured to construct a computer system with desired system specifications by combining components and setting, for each of the components, values of specified parameters,
the management apparatus including a memory that stores a plurality of templates prepared in advance, wherein the plurality of templates respectively correspond to a plurality of components and each of the plurality of templates is designed to set values of parameters regarding the component to which the parameters corresponds, and stores know-how information which is information to be recommended when constructing the computer system, and fault information which defines a handling strategy upon occurrence of a fault,
the management method comprising:
creating a logical model of the computer system with required system specifications which comprises multiple elements respectively corresponding to multiple components of the computer system among the plurality of components; and
setting the values of the parameters in multiple templates corresponding to the multiple components, to item templates which are respectively prepared for items of the system specifications, for each of the values of the parameters in each of the item templates, comparing the value of the parameter for the required system specifications with the value of the parameter in the item template, by referring to the know-how information or the fault information or the know-how information and the fault information, which is associated with the element corresponding to the component to which the parameter corresponds, thereby verifying whether or not the computer system to be built according to the values of the parameters in the item templates satisfies the required system specifications, and setting the values of the parameters in the item templates for which the computer system satisfies the required system specifications based on a result of the verification.

8. The management method according to claim 7,
wherein in creating the logical model, the management apparatus associates the know-how information, and the know-how information or the fault information or the know-how information and the fault information which is relevant upon occurrence of the fault, with a necessary node of the created logical model; and wherein in setting the values of the parameters in multiple templates corresponding to the multiple components to item templates which are respectively prepared for items of the system specifications, the management apparatus verifies whether the computer system to be built according to each of the parameters whose respective values are set to each of the templates, satisfies the required system specifications or not, by referring to the know-how information and the fault information.

9. The management method according to claim 7, further comprising displaying the verification result for each item of the system specifications.

10. The management method according to claim 9, further comprising:

in displaying the verification results, when the computer system to be built according to each of the parameters whose respective values are set to each of the templates does not satisfy the required system specifications, displaying a reason why the computer system does not satisfy the system specifications.

11. The management method according to claim 10, further comprising:

in displaying the verification results, displaying a parameter which is directly related to or influences the system specifications as a key parameter.

12. The management method according to claim 7, further comprising:

based on the result of the verification, using the values the parameters in the item templates that are set to build the computer system that satisfies the required system specifications.

* * * * *